United States Patent
Takahashi et al.

(10) Patent No.: US 8,035,432 B2
(45) Date of Patent: Oct. 11, 2011

(54) DLL CIRCUIT AND CONTROL METHOD THEREOF

(75) Inventors: Hiroki Takahashi, Chuo-ku (JP); Toru Ishikawa, Chuo-ku (JP)

(73) Assignee: Elpida Memory, Inc., Tokyo (JP)

( * ) Notice: Subject to any disclaimer, the term of this patent is extended or adjusted under 35 U.S.C. 154(b) by 77 days.

(21) Appl. No.: 12/603,850

(22) Filed: Oct. 22, 2009

(65) Prior Publication Data
US 2010/0102861 A1    Apr. 29, 2010

(30) Foreign Application Priority Data
Oct. 24, 2008    (JP) .................................. 2008-274440

(51) Int. Cl.
*H03L 7/06* (2006.01)

(52) U.S. Cl. ........................................ 327/158; 327/149

(58) Field of Classification Search .................. 327/149, 327/158
See application file for complete search history.

(56) References Cited

U.S. PATENT DOCUMENTS

| 7,385,428 | B2 * | 6/2008 | Lee et al. | 327/149 |
| 7,388,415 | B2 * | 6/2008 | Lee | 327/158 |
| 7,535,270 | B2 * | 5/2009 | Lee et al. | 327/147 |
| 7,605,623 | B2 * | 10/2009 | Yun et al. | 327/158 |
| 7,834,674 | B2 * | 11/2010 | Cho | 327/276 |
| 7,843,240 | B2 * | 11/2010 | Kim | 327/158 |
| 7,868,673 | B2 * | 1/2011 | Lee et al. | 327/158 |
| 7,873,131 | B2 * | 1/2011 | Lin et al. | 375/376 |
| 2008/0054964 | A1 * | 3/2008 | Lee et al. | 327/158 |
| 2008/0079470 | A1 * | 4/2008 | Yun et al. | 327/158 |

FOREIGN PATENT DOCUMENTS

JP    11-273342 A    10/1999

* cited by examiner

*Primary Examiner* — Lincoln Donovan
*Assistant Examiner* — Adam D Houston
(74) *Attorney, Agent, or Firm* — Sughrue Mion, PLLC

(57) ABSTRACT

A DLL circuit includes a first phase comparing circuit that compares phases between an input clock signal and an output clock signal, a first delay circuit that delays the output clock signal, and a second phase comparing circuit that compares phases between the input clock signal and an output signal of the first delay circuit. A delay amount in the variable delay circuit is controlled based on a comparison result of the first phase comparing circuit and a comparison result of the second phase comparing circuit.

18 Claims, 2 Drawing Sheets

DLL CIRCUIT AND CONTROL METHOD THEREOF

BACKGROUND OF THE INVENTION

1. Field of the Invention

The present invention relates to a DLL (Delay Locked Loop) circuit and a control method thereof, and, more particularly relates to a technique of controlling a lock time in a DLL circuit.

2. Description of Related Art

A DLL circuit compares phases between a received clock signal CLKi (reference clock) and a signal obtained by feeding back a clock signal CLKo output by a variable delay circuit (such as a voltage-controlled delay line) using a phase comparing circuit (PD), and reflects a comparison result on a delay time of the variable delay circuit. The DLL circuit performs control to advance or delay the phase of the clock signal CLKo, and finally operates such that the phases between the clock signal CLKo and the clock signal CLKi match (lock) each other.

In a conventional DLL circuit, a delay pitch of the variable delay circuit is constant. Thus, a lock time of the DLL circuit is calculated as: ("initial phase difference"/"phase adjusting step")×"cycle time period". Accordingly, when there is a large initial phase difference such as a time of power-input or returning to an operation mode from a standby mode, it takes a time to lock.

To shorten the lock time, Japanese Patent Application Laid-open No. H11-273342 discloses a DLL circuit that sets a delay amount to a vicinity of a delay amount required to lock on a variable delay circuit and the like, even when it is not in a normal operation mode, by measuring a delay amount corresponding to a predetermined cycles of an external clock signal by a clock-cycle measuring unit.

The following analysis is give to the present invention.

In the DLL circuit in Japanese Patent Application Laid-open No. H11-273342, it is required to include the clock-cycle measuring unit that measures a delay amount and to set the delay amount required to lock on a variable delay circuit or the like to the measured delay amount. Accordingly, operations therefore are complicated, and there is a possibility that its circuit size increases.

SUMMARY

The present invention seeks to solve one or more of the above problems, or to improve upon those problems at least in part.

In one embodiment, there is provided a DLL (delay locked loop) circuit having an input terminal and an output terminal, comprising: a first delay circuit that applies a first delay amount to an input signal having a predetermined frequency supplied to the input terminal to generate a delayed input signal as an output signal to the output terminal; a second delay circuit that further applies a second delay amount to the output signal to generates a first internal signal; a first comparing circuit that compares the input signal and the output signal to generate a first comparison result signal; a second comparing circuit that compares the input signal and the first internal signal to generate a second comparison result signal; and a control circuit that changes the first delay amount based on the first and second comparison result signals, wherein the control circuit changes the first delay amount of the first delay circuit by adding a first change amount to the first delay amount based on the first comparison result signal irrespective of the second comparison result signal when a lock determining signal indicating a state that a phase of the input signal and a phase of the output signal match is activated, and the control circuit changes the first delay amount of the first delay circuit by adding a second change amount larger in absolute value than the first change amount to the first delay amount based on the first and second comparison result signals, when the lock determining signal is not activated.

In another embodiment, there is provided a DLL circuit that outputs an input clock signal as an output clock signal via a variable delay circuit and that controls a delay amount in the variable delay circuit based on a phase comparison result between the input clock signal and the output clock signal, the DLL circuit comprising: a first phase comparing circuit that compares phases between the input clock signal and the output clock signal; a first delay circuit that delays the output clock signal; and a second phase comparing circuit that compares phases between the input clock signal and an output signal of the first delay circuit, wherein a delay amount in the variable delay circuit is controlled based on a comparison result of the first phase comparing circuit and a comparison result of the second phase comparing circuit.

In another embodiment, there is provided a method of controlling a DLL circuit that outputs an input clock signal as an output clock signal via a variable delay circuit, and that controls a delay amount in the variable delay circuit based on a phase comparison result between the input clock signal and the output clock signal, the method comprising: comparing phases between the input clock signal and the output clock signal; delaying the output clock signal; comparing phases between the input clock signal and the delayed output clock signal; and controlling a delay amount in the variable delay circuit based on a comparison result of phases between the input clock signal and the output clock signal and a comparison result of phases between the input clock signal and the delayed output clock signal.

According to the present invention, the delay amount is controlled by a second phase comparison in order to shorten the lock time, and thus the configuration becomes simple and suppression of an increase in circuit size can be achieved.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENTS

Figure 1:
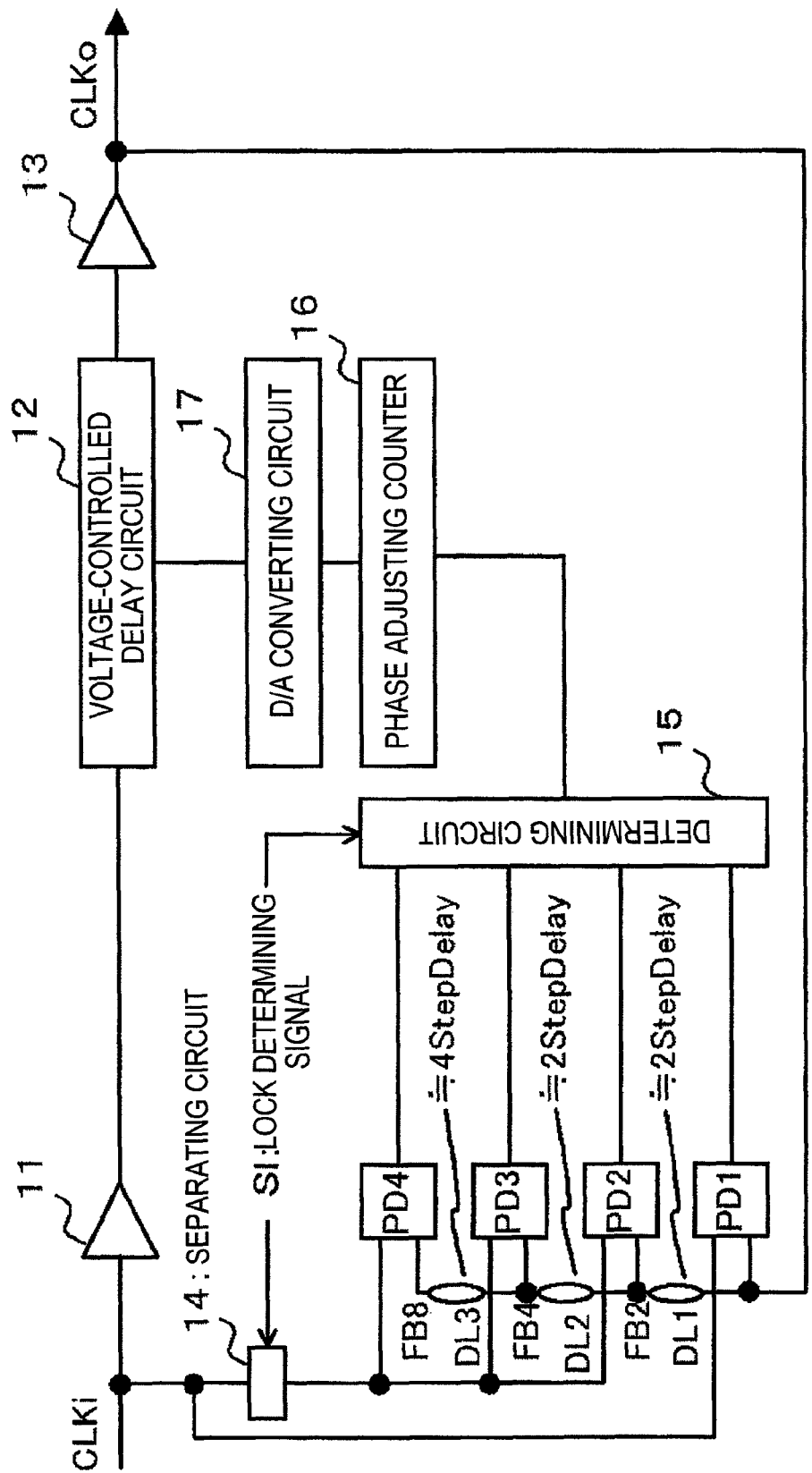
FIG. 1 is a block diagram of a configuration of a DLL circuit according to an embodiment of the present invention.

A DLL circuit according to an embodiment of the present invention outputs an input clock signal (CLKi in FIG. 1) as an output clock signal (CLKo in FIG. 1) via a variable delay circuit (reference numeral 12 in FIG. 1), and also, controls a delay amount in the variable delay circuit based on a phase comparison result between the input clock signal and output clock signal. The DLL circuit includes: a first phase comparing circuit (PD1 in FIG. 1) that compares the phases between the input clock signal and the output clock signal; a first delay circuit (DL1 in FIG. 1) that delays the output clock signal; and a second phase comparing circuit (PD2 in FIG. 1) that compares the phases between the input clock signal and an output signal of the first delay circuit. The DLL circuit is configured such that the delay amount in the variable delay circuit is controlled based on a comparison result of the first phase comparing circuit and a comparison result of the second phase comparing circuit.

The DLL circuit can be configured to further include an (I+1)th delay circuit that delays an output signal of an Ith delay circuit (I=1 to N, where N is an integer equal to or larger than 1), and an (I+2)th phase comparing circuit that compares phases between the input clock signal and an output signal of the (I+1)th delay circuit, whereby, based on the comparison result of the (I+2)th phase comparing circuit, the delay amount in the variable delay circuit is further controlled.

In the DLL circuit, when the DLL circuit is in a locked state, it is preferable that the delay amount in the variable delay circuit is controlled exclusively based on the comparison result of the first phase comparing circuit.

The DLL circuit can be configured to include a phase adjusting counter that counts a count value for controlling the delay amount in the variable delay circuit, whereby when the second phase comparing circuit determines that a phase difference between the input clock signal and the output signal of the first delay circuit is larger than a predetermined value, the phase adjusting counter further increases an increment/decrement amount of the count value based on the phase comparison result of the first phase comparing circuit.

The DLL circuit can be configured such that, as the DLL circuit reaches a locked state from an initial state, involvement in controlling the delay amount in the variable delay circuit is excluded in an order from the (I+2)th phase comparing circuit to the second phase comparing circuit.

Thus, the DLL circuit includes a plurality of phase comparing circuits, and in each phase comparing circuit, a phase difference amount is detected by shifting the phase of the output clock signal that is fed back, and the phase adjusting amount according to the phase difference amount is adjusted. According to the DLL circuit, when the phase adjusting amount is adjusted according to the phase difference, it becomes possible to shorten a lock time. Moreover, complicated sequence control is not required, and thus it is possible to suppress an increase in the area of a logical circuit.

Embodiments of the present invention are described blow in detail with reference to the accompanying drawings.

FIG. 1 is a block diagram showing a configuration of the DLL circuit according to the embodiment. In FIG. 1, the DLL circuit includes an input buffer 11, a voltage-controlled delay circuit (voltage-controlled delay line, VCDL) 12, an output buffer 13, a separating circuit 14, phase comparing circuits PD1, PD2, PD3, and PD4, delay circuits DL1, DL2, and DL3, a determining circuit 15, a phase adjusting counter 16, and a D/A converting circuit 17.

The input buffer 11 inputs a clock signal CLKi from outside, and outputs the signal to an input terminal of the voltage-controlled delay circuit 12. The clock signal CLKi is also supplied to the separating circuit 14 and one of the input terminals the phase comparing circuit PD1. The voltage-controlled delay circuit 12 is a variable delay circuit that controls a delay amount according to an output signal of the D/A converting circuit 17, delays an output signal of the input buffer 11, and outputs the signal to the output buffer 13. The output buffer 13 buffers the output signal of the voltage-controlled delay circuit 12, outputs the signal as a clock signal CLKo to outside from the DLL circuit, and outputs the signal to the other input terminal of the phase comparing circuit PD1 and to an input terminal of the delay circuit DL1.

The separating circuit 14 supplies the clock signal CLKi to each one input terminal of the phase comparing circuits PD2, PD3, and PD4 when it is indicated that a lock determining signal Sl is not in a locked state, and blocks the supply of the clock signal CLKi to the phase comparing circuits PD2, PD3, and PD4 when it is indicated that the lock determining signal Sl is in a locked state.

The delay circuits DL1, DL2, and DL3 have a cascade connection such that respective output terminals (FB2, FB4, and FB8) thereof are connected to the other input terminals of the respective phase comparing circuits PD2, PD3, and PD4. In this case, the delay circuits DL1, DL2, and DL3 are to have delays two times, two times, and four times a phase adjusting step in one unit, respectively.

Each comparison result of the phase comparing circuits PD1, PD2, PD3, and PD4 is input to the determining circuit 15. The determining circuit 15 outputs the comparison result or determination result to the phase adjusting counter 16. The phase adjusting counter 16 counts the comparison result, and the D/A converting circuit 17 performs D/A conversion on the count result and applies the same to the voltage-controlled delay circuit 12 so that the delay amount in the voltage-controlled delay circuit 12 is controlled. That is, the determining circuit 15 understands the phase difference amount between the current clock signal CLKo and the clock signal CLKi from the phase comparison results of the phase comparing circuits PD1, PD2, PD3, and PD4. Accordingly, for example, by associating the output of the phase comparing circuit PD4 with a higher bit of the phase adjusting counter, the output of the phase comparing circuit PD3 with a lower bit of the phase adjusting counter, the output of the phase comparing circuit PD2 with a further lower bit of the phase adjusting counter, and the output of the phase comparing circuit PD1 with a lowest bit thereof, it becomes possible to change the phase adjusting amount per one cycle according to the phase difference amount based on the comparison results of the phase comparing circuits PD1 to PD4.

Figure 2:
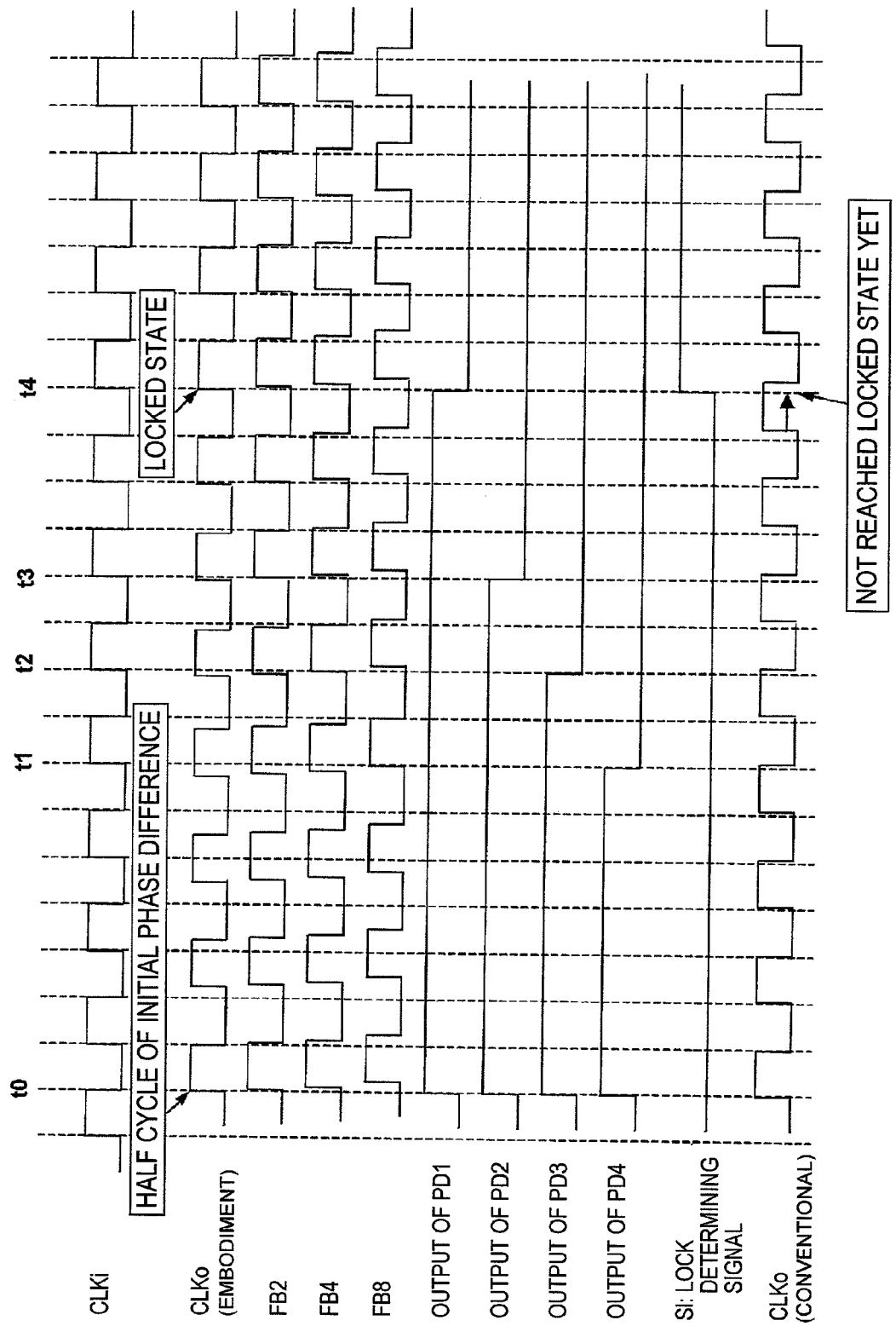
FIG. 2 is a timing chart representing the operation of the DLL circuit according to the present embodiment.

An operation of the DLL circuit with such a configuration is described next. FIG. 2 is a timing chart representing the operation of the DLL circuit according to the present embodiment. It is assumed that at a timing to, an initial phase difference between the clock signal CLKi and the clock signal CLKo is deviated by half a cycle, and thus the phase difference is eight times or more of a phase control step. In this case, the determining circuit 15 associates the results of the phase comparing circuits PD1 to PD4 with a lower first bit to fourth bit of the phase adjusting counter 16. That is, all the output results of the phase comparing circuits PD1 to PD4 instruct a phase DN (to delay the phase) as an H level, and thus, in total, eight times the phase adjusting step is adjusted in one cycle.

Next, at a timing t1, when only the phase comparing circuit PD4 is changed to a phase UP (to advance the phase) as an L level, the determining circuit 15 associates the results of the phase comparing circuits PD1 to PD3 with a lower first bit to third bit of the phase adjusting counter 16. Accordingly, four times the phase adjusting step is adjusted in one cycle.

Further, at a timing t2, when the phase comparing circuit PD3 is changed to the phase UP, the determining circuit 15 associates the results of phase comparing circuits PD1 to PD2 with a lower first bit to second bit of the phase adjusting counter 16. Accordingly, two times the phase adjusting step is adjusted in one cycle. At a timing t3, when the phase comparing circuit PD2 is changed to the phase UP, the determining circuit 15 associates the results of the phase comparing circuit PD1 with a lower 1 bit of the phase adjusting counter 16. The amount of the phase adjusting step is adjusted in one cycle.

At a timing t4, the phases between the clock signal CLKi and the clock signal CLKo match each other, and this results in a locked state.

In this way, in the DLL circuit, as the phase adjustment advances, the phase comparison results of the phase comparing circuits PD2 and PD3 are gradually changed from the instruction for the phase DN to the instruction for the phase UP. As a result, as it reaches a locked state, the DLL circuit decreases the phase adjusting amount from a 2-phase adjusting step to a 1-phase adjusting step.

After locking is completed in the DLL circuit, the lock determining signal Sl is activated and the phase comparing circuits PD2 to PD4 are separated from the clock signal CLKi using the separating circuit 14 so that an unnecessary phase adjustment is not performed due to disturbances such as jitter, and at the same time, the DLL circuit changes control of the determining circuit 15 for the phase adjusting amount so that the phase adjustment is performed exclusively based on the results of the phase comparing circuit PD1. The determination of whether the lock determining signal Sl is activated is performed based on a change in the phase adjusting amount, and a count signal, such as hundreds of cycles of the clock signal CLKi, for example. Accordingly, the lock determining signal Sl is generated using a lock determining circuit (not shown) within the DLL circuit.

The following applications can be added to the disclosure of the embodiment described above. Based on the lock determining signal, the phase comparing circuits PD2 to PD4 are capable of significantly reducing a power consumption by stopping the operation of the circuits thereof. The same is true for the delay circuits DL1 to DL3. As the DLL circuit reaches a locked state from an initial state (an unlocked state), it is also possible to stop circuit operations in an order from the phase comparing circuit PD3 to the phase comparing circuit PD4, and then the phase comparing circuit PD2. Corresponding to this, the determining circuit 15 excludes involvement in controlling the delay amount in the variable delay circuit.

In the above descriptions, the phase adjustment is performed using a rise edge as a reference. However, the present invention is not limited thereto, and the phase adjustment can be also applied to a fall edge. Moreover, the phase adjustment can be applied to both edges, that is, both of the rise edge and fall edge. Further, it can be configured such that the number of phase comparing circuits for the rise edge and the fall edge (including the delay circuit for a phase shift of the accompanying clock signal CLKo) is an arbitrary number of two or more.

According to the DLL circuit, by adjusting the phase adjusting amount according to the phase difference, the time required until the lock is completed can be shortened. Further, complicated sequence control is not required, and thus an increase in the area of the logical circuit can be suppressed.

Disclosures of patent document mentioned above or the like are incorporated herein by reference. Embodiments and examples of the present invention can be changed or modified within the scope of the entire disclosure of the invention (including the scope of the claims) and based on the basic technical spirit thereof. Many combinations and selections of various disclosed elements can be made within the scope of the claims of the present invention. That is, it is obvious that the present invention embraces the entire disclosure thereof including the scope of the claims and various changes and modifications that will be achieved by those skilled in the art based on the technical spirit of the invention.

The DLL circuit according to the present invention can be incorporated in various semiconductor devices. The semiconductor device according to the invention of the present application can be applied to semiconductor products in general, such as a CPU (Central Processing Unit), an MCU (Micro Control Unit), a DSP (Digital Signal Processor), an ASIC (Application Specific Integrated Circuit), and an ASSP (Application Specific Standard Circuit). Devices to which the present application is applied can be applied to semiconductor devices such as an SOC (system on chip), an MCP (multi chip package), and a POP (package on package). Moreover, it is possible that the format of circuits such as an input buffer, a voltage-controlled delay circuit, a phase comparing circuit, an output buffer, a D/A converting circuit, a phase adjusting counter, a determining circuit, a separating circuit, and a delay circuit is arbitrarily designed to achieve the characteristics respective circutis. The clock signal CLKi in the DLL circuit according to the present invention is an input terminal of the DLL circuit and the output clock signal CLKo is an output terminal of the DLL circuit. The input terminal of the DLL circuit can be an external terminal of the semiconductor device. The output terminal of the DLL circuit is connected to a synchronous control terminal of an internal circuit connected to the output terminal of the semiconductor device. The internal circuit outputs an internal signal to the output terminal according to the output clock signal CLKo. Thus, the internal signal output to the output terminal is a signal synchronized (phase-matched) with the clock signal CLKi that controls the semiconductor device.

What is claimed is:

1. A DLL (delay locked loop) circuit having an input terminal and an output terminal, comprising:
   a first delay circuit that applies a first delay amount to an input signal having a predetermined frequency supplied to the input terminal to generate a delayed input signal as an output signal to the output terminal;
   a second delay circuit that further applies a second delay amount to the output signal to generates a first internal signal;
   a first comparing circuit that compares the input signal and the output signal to generate a first comparison result signal;
   a second comparing circuit that compares the input signal and the first internal signal to generate a second comparison result signal; and
   a control circuit that changes the first delay amount based on the first and second comparison result signals, wherein
   the control circuit changes the first delay amount of the first delay circuit by adding a first change amount to the first delay amount based on the first comparison result signal irrespective of the second comparison result signal when a lock determining signal indicating a state that a phase of the input signal and a phase of the output signal match is activated, and
   the control circuit changes the first delay amount of the first delay circuit by adding a second change amount larger in absolute value than the first change amount to the first delay amount based on the first and second comparison result signals, when the lock determining signal is not activated.

2. The DLL circuit as claimed in claim 1, wherein the second comparing circuit stops an operation of comparing the input signal and the first internal signal when the lock determining signal is activated.

3. The DLL circuit as claimed in claim 2, further comprising a separating circuit that prevents the input signal from inputting to the second comparing circuit based on the lock determining signal.

4. The DLL circuit as claimed in claim 1, wherein
the control circuit includes a phase adjusting counter that applies the first change amount and the second change amount to the first delay amount,
the first comparison result signal corresponds to a lower bit of the phase adjusting counter, and
the second comparison result signal corresponds to a higher bit, which is higher than the lower bit of the phase adjusting counter.

5. The DLL circuit as claimed in claim 4, wherein
the control circuit includes a determining circuit arranged between the first and second comparing circuits and the phase adjusting counter, and
the determining circuit invalidates the second comparison result signal in response to the lock determining signal.

6. A DLL circuit that outputs an input clock signal as an output clock signal via a variable delay circuit and that controls a delay amount in the variable delay circuit based on a phase comparison result between the input clock signal and the output clock signal, the DLL circuit comprising:
a first phase comparing circuit that compares phases between the input clock signal and the output clock signal;
a first delay circuit that delays the output clock signal; and
a second phase comparing circuit that compares phases between the input clock signal and an output signal of the first delay circuit,
wherein a delay amount in the variable delay circuit is controlled based on a comparison result of the first phase comparing circuit and a comparison result of the second phase comparing circuit, and
wherein the delay amount in the variable delay circuit is controlled exclusively based on the comparison result of the first phase comparing circuit when the DLL circuit is in a locked state.

7. The DLL circuit as claimed in claim 6, further comprising:
an (I+1)th delay circuit that delays an output signal of an Ith delay circuit (I=1 to N, where N is an integer equal to or larger than 1); and
an (I+2)th phase comparing circuit that compares phases between the input clock signal and an output signal of the (I+1)th delay circuit,
wherein the delay amount in the variable delay circuit is further controlled based on a comparison result of the (I+2)th phase comparing circuit.

8. The DLL circuit as claimed in claim 6, further comprising a phase adjusting counter that counts a count value for controlling the delay amount in the variable delay circuit,
wherein the phase adjusting counter increases an increment/decrement amount of the count value based on a phase comparison result of the first phase comparing circuit when the second phase comparing circuit determines that a phase difference between the input clock signal and the output signal of the first delay circuit is larger than a predetermined value.

9. The DLL circuit as claimed in claim 7, wherein as the DLL circuit reaches a locked state from an initial state, involvement in controlling the delay amount in the variable delay circuit is excluded in an order from the (I+2)th phase comparing circuit to the second phase comparing circuit.

10. The DLL circuit as claimed in claim 6, wherein when the DLL circuit is in a locked state, the second phase comparing circuit stops comparing operation thereof.

11. The DLL circuit as claimed in claim 10, further comprising a separating circuit that prevents the input clock signal from inputting to the second phase comparing circuit when the DLL circuit is in a locked state.

12. The DLL circuit as claimed in claim 7, wherein as the DLL circuit reaches a locked state from an initial state, the (I+2)th phase comparing circuit stops a comparing operation in an order from the (I+2)th phase comparing circuit to the second phase comparing circuit.

13. A method of controlling a DLL circuit that outputs an input clock signal as an output clock signal via a variable delay circuit, and that controls a delay amount in the variable delay circuit based on a phase comparison result between the input clock signal and the output clock signal, the method comprising:
comparing phases between the input clock signal and the output clock signal;
delaying the output clock signal;
comparing phases between the input clock signal and the delayed output clock signal; and
controlling a delay amount in the variable delay circuit based on a comparison result of phases between the input clock signal and the output clock signal and a comparison result of phases between the input clock signal and the delayed output clock signal.

14. The method of controlling a DLL circuit as claimed in claim 13, wherein the delay amount in the variable delay circuit changed based on the comparison result of phases between the input clock signal and the delayed output clock signal is a delay amount larger in absolute value than that of the variable delay circuit changed based on the comparison result of phases between the input clock signal and the output clock signal.

15. The method of controlling a DLL circuit as claimed in claim 13, wherein when the DLL circuit is in a locked state, controlling the delay amount is performed exclusively based on the comparison result of phases between the input clock signal and the output clock signal.

16. The method of controlling a DLL circuit as claimed in claim 15, wherein when the DLL circuit is in a locked state, comparing the phases between the input clock signal and the delayed output clock signal is stopped.

17. The method of controlling a DLL circuit as claimed in claim 16, wherein when the DLL circuit is in a locked state, supplying the input clock signal is stopped in the comparing the phases between the input clock signal and the delayed output clock signal.

18. The DLL circuit as claimed in claim 7, wherein the output signal of the Ith delay circuit is supplied to an input node of the (I+1)th delay circuit.

* * * * *